(12) United States Patent
Linnell

(10) Patent No.: US 11,366,146 B1
(45) Date of Patent: Jun. 21, 2022

(54) UTILITY METER PEDESTAL FOR PROVIDING PRE-CONSTRUCTION POWER FROM UNDERGROUND SERVICE

(71) Applicant: Matthew P. Linnell, Commerce Township, MI (US)

(72) Inventor: Matthew P. Linnell, Commerce Township, MI (US)

( * ) Notice: Subject to any disclaimer, the term of this patent is extended or adjusted under 35 U.S.C. 154(b) by 45 days.

(21) Appl. No.: 17/116,502

(22) Filed: Dec. 9, 2020

(51) Int. Cl.
*G01R 22/06* (2006.01)

(52) U.S. Cl.
CPC ......... *G01R 22/065* (2013.01); *G01R 22/066* (2013.01)

(58) Field of Classification Search
CPC .............................. H02B 1/03; H02B 1/26–52
See application file for complete search history.

(56) References Cited

U.S. PATENT DOCUMENTS

| | | | |
|---|---|---|---|
| 3,879,641 A | 4/1975 | Byrd | |
| 4,751,610 A | 6/1988 | Nickola | |
| 4,833,566 A | 5/1989 | Nickola | |
| 4,864,467 A | 9/1989 | Byrd et al. | |
| 4,977,482 A * | 12/1990 | Langdon | G01R 11/04 324/156 |
| 5,400,212 A | 3/1995 | Hanson | |
| 7,397,652 B2 * | 7/2008 | Price | H02B 1/52 324/156 |
| 7,435,902 B2 * | 10/2008 | Thornton | G01R 11/04 361/664 |
| 7,850,483 B2 | 12/2010 | Siglock et al. | |
| 7,905,748 B2 * | 3/2011 | Benke | H01R 31/06 439/517 |
| 8,089,747 B2 * | 1/2012 | Storck | B60L 53/31 361/641 |
| 8,467,171 B2 * | 6/2013 | Brown | H02B 1/52 361/625 |
| 9,054,510 B2 * | 6/2015 | Cardin | H02G 3/083 |
| 2004/0165340 A1 * | 8/2004 | Wilfong | H02B 1/50 361/664 |

* cited by examiner

*Primary Examiner* — Huy Q Phan
*Assistant Examiner* — David B Frederiksen
(74) *Attorney, Agent, or Firm* — Young Basile Hanlon & MacFarlane, P.C.

(57) ABSTRACT

An electric utility meter pedestal with provision for providing pre-construction power from underground service comprising an elongate support for a double compartment meter housing the upper portion of which accommodates a standard utility meter and the lower portion of which provides secure access to a pre-construction 110-volt duplex outlet and a breaker switch for that outlet. Access to the duplex outlet is made secure by virtue of an outer cover panel which can be put in place to fully cover and limit access to the outlet after the construction of the building has been complete. The 20 amp duplex outlet therefore provides 110 volt 20 amp service to workmen using tools during the construction phase as well as a convenient outdoor outlet for the homeowner after construction is complete.

3 Claims, 6 Drawing Sheets

UTILITY METER PEDESTAL FOR PROVIDING PRE-CONSTRUCTION POWER FROM UNDERGROUND SERVICE

FIELD OF THE INVENTION

This document discloses a pedestal which is mountable on a building foundation for making metered power available during construction of a building on the foundation.

DESCRIPTION OF THE PRIOR ART

Utility meter pedestals have been designed and patented for pre-construction mounting on a building foundation; i.e. mounting on a foundation prior to and during construction of walls and other building component on the foundation during a construction phase. In all such prior art pedestals a temporary power outlet is provided in association with a meter in a primary meter housing so as to provide metered 110-volt, 20 amp power to workman using tools during the construction phase that require 110-volt electrical power. Examples are shown in U.S. Pat. No. 3,879,641 issued Apr. 22, 1975 in which the auxiliary or temporary power outlet is provided in a box 138, in U.S. Pat. No. 4,864,467 by box 26 and in U.S. Pat. No. 5,400,212 at box 54. In all cases, the temporary power outlet boxes are removed after the construction phase is finished to the point where the temporary power outlet is no longer needed. This, however, requires access to the primary power connections in the main meter box a procedure which requires the expertise of an electrician.

SUMMARY OF THE DISCLOSURE

The primary purpose of the present invention disclosed herein is to eliminate the separate pre-construction, temporary power outlet box from the pedestal along with the need to disconnect and remove it after construction is finished. In general, this is accomplished by providing a meter housing which is mountable on an elongate support with provision to accommodate underground service cables wherein the housing accommodates both a main meter with service disconnect as well as an accessible 110 volt 20 amp outlet. The housing is mountable by means of said support on a foundation in the pre-construction phase. The housing provides upper and lower interior compartments, the upper compartment of which is provided with the electrical apparatus necessary to receive and activate a conventional electric utility meter. The apparatus may, for example, be as shown U.S. Pat. No. 7,850,483 issued Dec. 4, 2010 and assigned to Milbank Manufacturing Company of Kansas City Mo.

The lower compartment is provided with an interior panel, preferably made of metal and painted or otherwise finished for durability. This interior panel has mounted thereon in user accessible fashion a duplex 110-volt outlet and a single pole 20 amp switch acting as a breaker for controlling power from the meter apparatus to the outlet. In addition, the lower compartment includes an outer panel which mounts fully over the inner panel and can be locked to prevent or at least limit access to the 110 volt 20 amp outlet and the switch which controls power to the outlet, thus, eliminating the need to provide and ultimately remove a separate temporary power outlet box. This not only eliminates the necessity for removal of the temporary outlet but also provides additional convenience to the owner/occupant of the building post construction by making electrical power available for use outside the building for, by way of example, lawn maintenance equipment or other 110-volt accessories/devices.

DETAILED DESCRIPTION OF THE ILLUSTRATIVE EMBODIMENT

Figure 1:
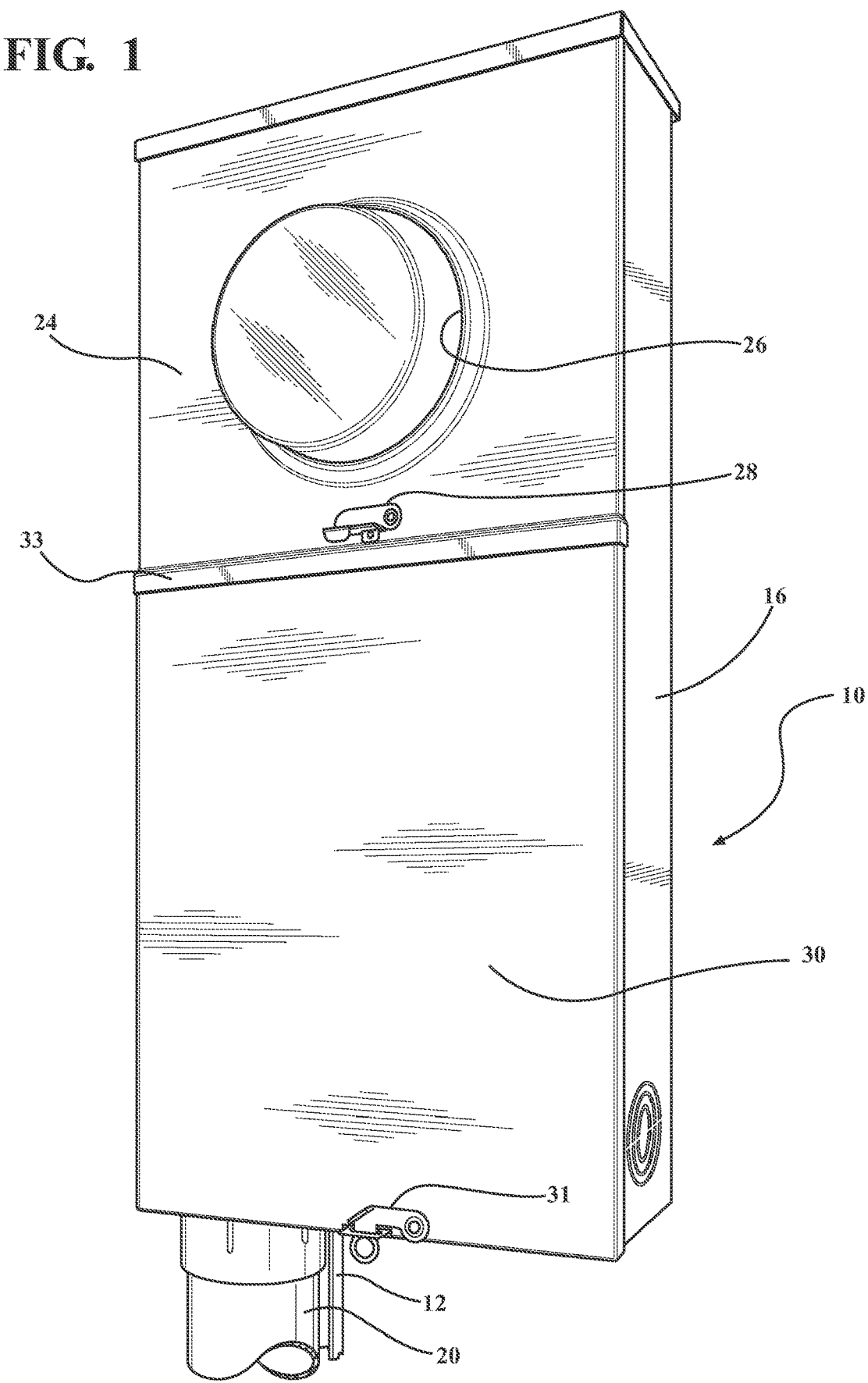
FIG. 1 is a perspective drawing of the top of a pedestal with a utility meter housing equipped to accommodate underground service cables.

Referring to the figures, a utility meter pedestal 10 according to the present invention is shown to comprise an elongate steel support member 12 having attached to it at the upper end a painted steel meter housing 16 using threaded fasteners. The support member 12 also carries toward the bottom end a plate 18 shown in FIGS. 5 and 6 which is designed to be nailed to the front surface of a foundation in a location that allows the support member 12 and the meter box 16 to extend above the foundation in the pre-construction phase. The shallow C shaped cross section of member 12 is one of several configurations and mounting arrangements that are possible as shown in the prior art listed above, the content of which is incorporated herein by reference.

The combination further comprises a plastic tube 20 which is secured to the bottom of the meter housing 16 to bring underground service cables 17 into the meter box for attachment to the meter and to the series of individual circuits that go into the building. Clamps may be used to secure the plastic tube 20 to the support member 12 at one or more places along its length. The complete pedestal is approximately five feet ten inches tall.

The meter housing comprises an upper compartment defined in the FIGS. by a metal front panel 24 of painted metal such as steel having a circular opening 26 through which the meter glass face extends in conventional fashion. The front panel 24 has a latch fixture 28 that allows it to be secured in place for limited access by, for example, a utility company representative.

Figure 2:
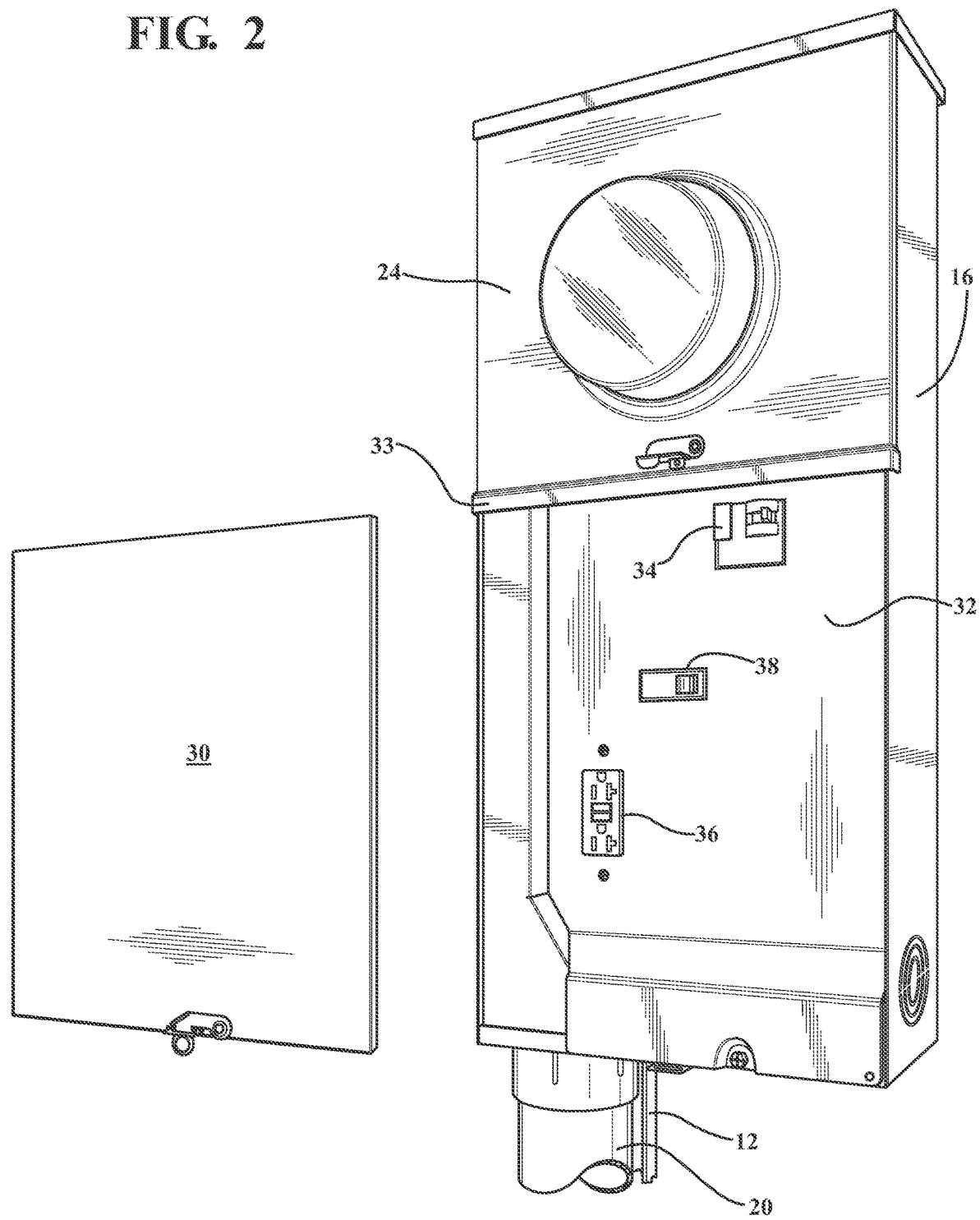
FIG. 2 is a perspective view of the meter housing with the outer panel of the lower compartment removed for access to the 110-volt outlet, the breaker switch for that outlet and the main service disconnect breaker switch.

The meter housing 16 further comprises a lower compartment defined in part by a removable front panel 30 of painted metal having a latch 31 at the bottom so as to be removable to provide access to the interior thereof as shown in FIG. 2. Removal is accomplished by swinging the panel 30 out and pulling the upper edge of it down from the interlocking relationship with the bezel or lip 33 of the upper panel 24. Once the panel 30 is removed access is provided to an inner panel 32 which is also made of painted metal whereon a service disconnect switch 34 with a 200 amp capacity is provided for shutting off all metered power to the building once a full complement of electric service is provided. The service disconnect 34 is preferably provided with an appropriate label.

Figure 3:
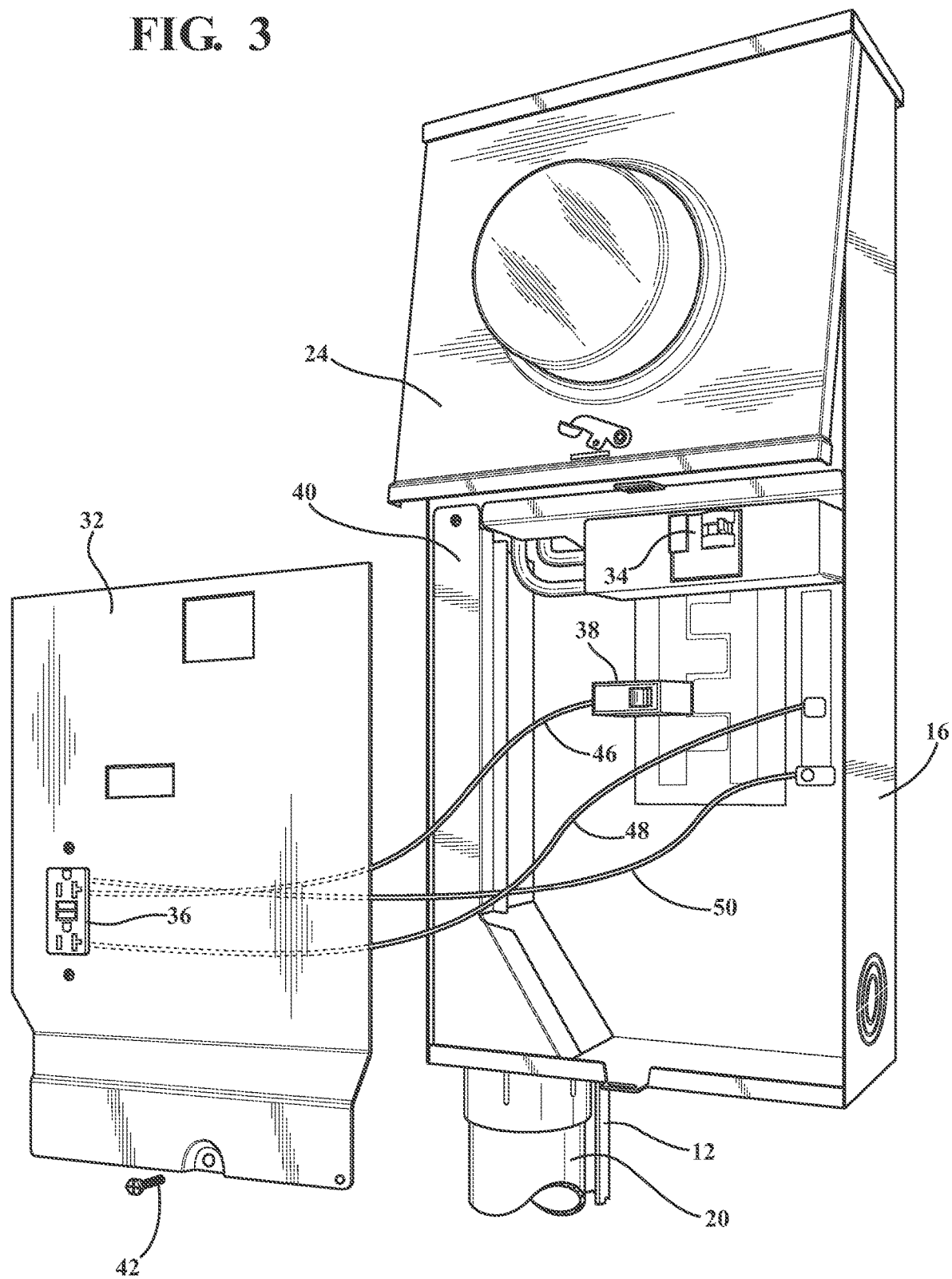
FIG. 3 is a perspective drawing showing the meter housing with the inner panel removed.
Figure 4:
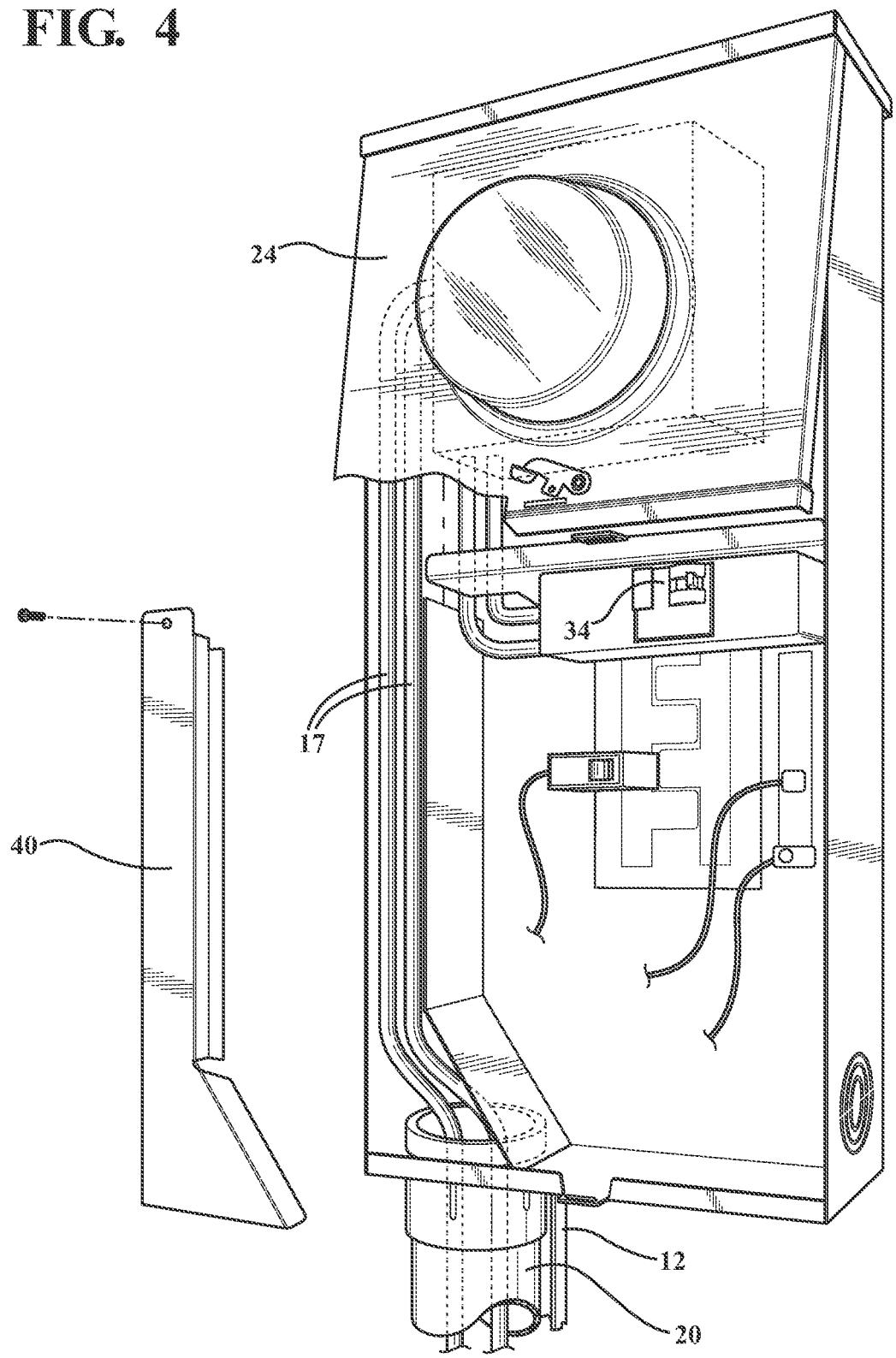
FIG. 4 is a perspective view of the meter housing with a guard member removed from the lower compartment to show the service cables entering the meter housing.

In addition, the interior panel 32 carries a 110-volt 20 amp duplex outlet 36 connected to a single pole 20 amp switch 38 readily accessed by a user once the front panel 30 is removed. The outlet 36 and switch 38 are wired into the main power supply as shown in FIG. 3.

Figure 5:
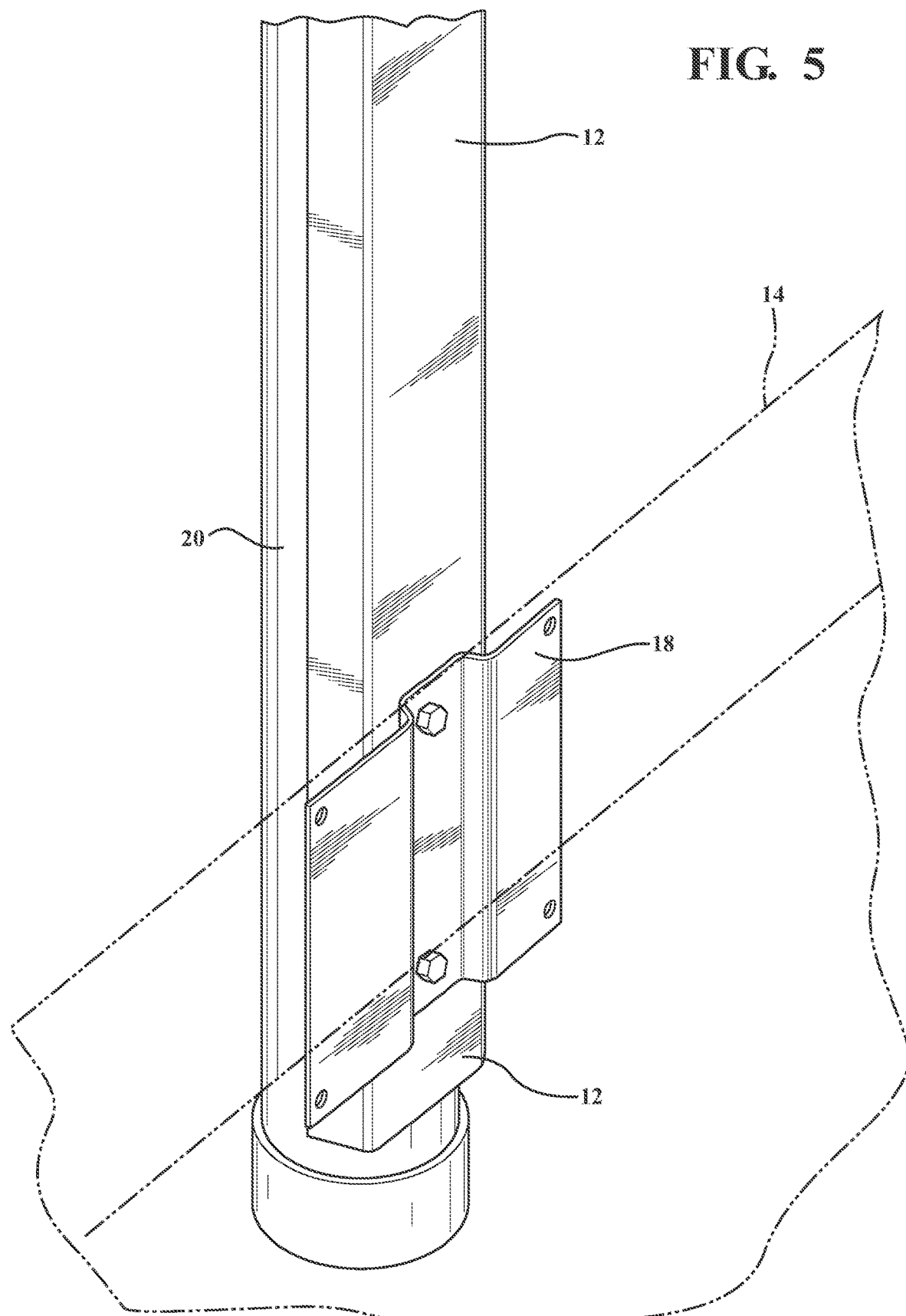
FIG. 5 is a perspective view of the rear of the pedestal showing the back of the main support and the foundation attachment plate attached to the lower end thereof and FIG. 6 is a front view of the entire pedestal with the meter housing fully mounted.
Figure 6:
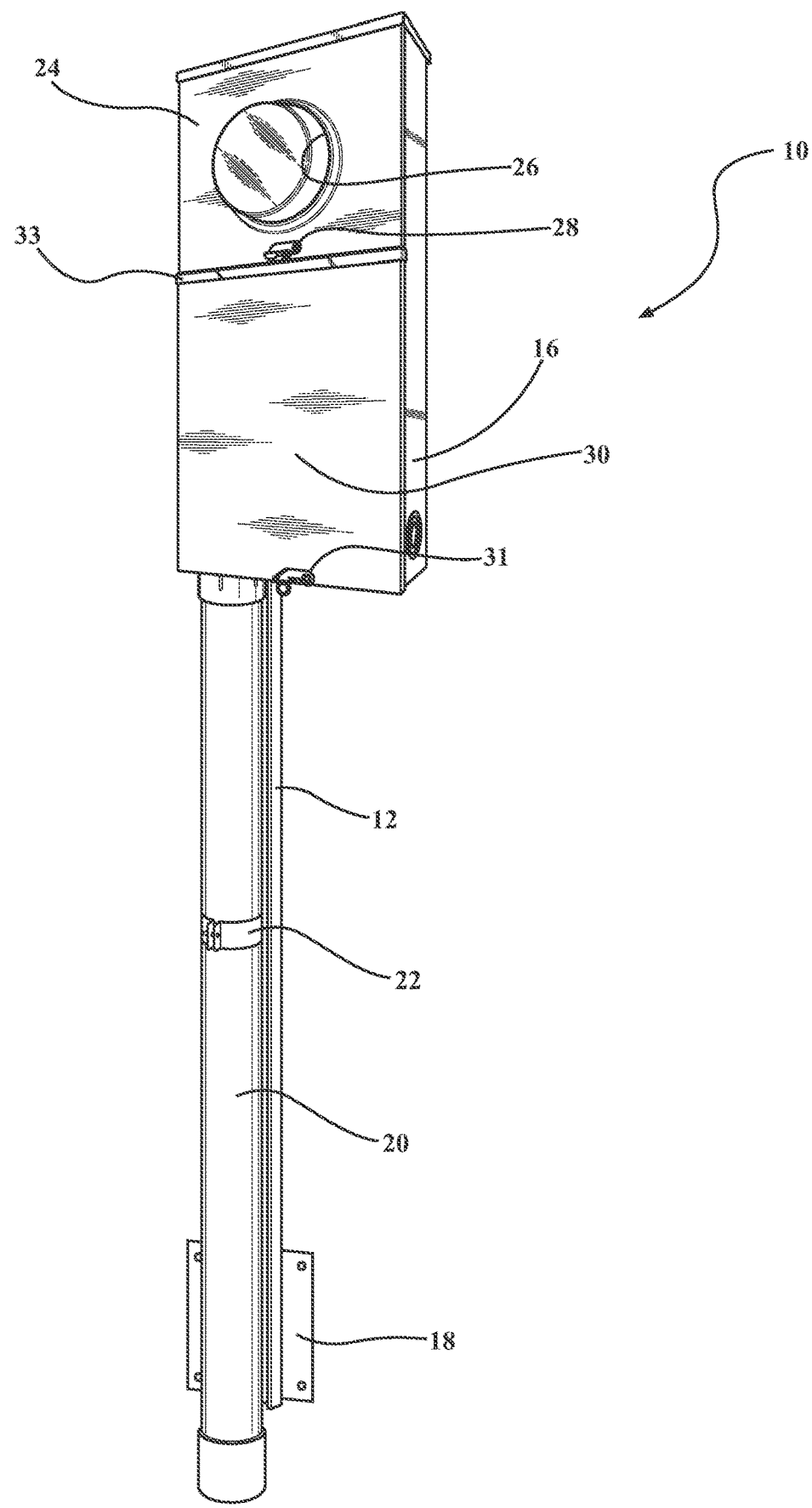

As shown in FIG. 5, a guard member 40 is provided to cover the main 200 amp power cables that come up through the tube 20, along the left side of the lower compartment and into the upper compartment for connection to the meter components.

A threaded fastener 42 is provided at the bottom of the lower panel 32 which allows it to be removed by an appropriate tool as shown in the drawing to provide access to the interior of the lower compartment. With panel 32 removed, as shown in FIG. 3 wires 46, 48 and 50 are used to attach the duplex outlet 36 and switch 34 to metered power in the upper compartment.

In summary, the pedestal carries a meter housing with two compartments: the upper compartment providing a conventional mounting structure for an electric utility meter and the lower compartment providing controlled access to a switch controlled, 110-volt 20 amp duplex outlet during the construction phase. The lower outer panel 30 shown in the open condition for access to the duplex plug outlet 36 and the switch 38 can, when construction is either paused or finished, be put in place and locked to limit access to the duplex outlet 36 and the switch 38. Therefore, the mechanisms and components that provide temporary power during the construction phase do not have to be removed but, for additional convenience for the building owner and user, can remain in place accessible through the use of simple tools and/or locking mechanisms to provide outdoor 110-volt 20 amp service.

It is to be understood that the invention covered by this document has been described and illustrated with respect to an illustrative embodiment and that various changes in shape, size, configuration and other aspects can be made without departing from the scope and content of the invention as defined by the appended claims.

What is claimed is:

1. An electric utility meter pedestal to provide pre-construction power comprising:
    an elongate support member for attachment to a building foundation;
    an elongate, generally rectangular, metal housing having a rear panel and full length parallel side panels; attached to the support member, said metal housing having separate upper and lower interior compartments;
    the upper interior compartment being configured to receive an electric utility meter with a face on display;
    the lower interior compartment extending to the bottom of said housing;
    each of said upper and lower compartments having separate outer metal covers that interfit with one another to fully close the housing when installed thereon;
    the upper compartment cover having an opening for the face of a meter when installed within the upper compartment;
    said lower compartment having mounted therein a service disconnect switch for controlling power from the meter, and a single pole switch controlling 20 amp, 110 volt power;
    an inner panel attachable to said housing and sized to cover the entirety of the lower compartment; said inner panel carrying a 110 volt duplex outlet on the face thereof; said outlet being wired into the single pole switch in the lower compartment; said inner panel having formed therein openings to provide user access to the service disconnect switch and the single pole switch when the inner panel is installed on the housing and
    the outer cover for the lower compartment being adapted for placement over the inner panel and the entirety of the lower compartment to conceal and control access to said outlet and single pole switch.

2. An electric utility meter pedestal as defined in claim 1 wherein said lower compartment outer cover includes means to prevent unauthorized removal.

3. An electric utility meter pedestal as defined in claim 1 further including a conduit of insulative material attached to said elongate support member for conveying underground power cables to said meter housing upper compartment.

* * * * *